(12) United States Patent
Freimann

(10) Patent No.: US 8,537,332 B2
(45) Date of Patent: Sep. 17, 2013

(54) PROJECTION EXPOSURE TOOL FOR MICROLITHOGRAPHY WITH A MEASURING APPARATUS AND METHOD FOR MEASURING AN IRRADIATION STRENGTH DISTRIBUTION

(75) Inventor: Rolf Freimann, Aalen (DE)

(73) Assignee: CARL ZEISS SMT GmbH, Oberkochen (DE)

( * ) Notice: Subject to any disclaimer, the term of this patent is extended or adjusted under 35 U.S.C. 154(b) by 843 days.

(21) Appl. No.: 12/507,694

(22) Filed: Jul. 22, 2009

(65) Prior Publication Data

US 2010/0020302 A1 Jan. 28, 2010

Related U.S. Application Data

(63) Continuation-in-part of application No. PCT/EP2008/000253, filed on Jan. 15, 2008.

(60) Provisional application No. 60/881,931, filed on Jan. 23, 2007.

(30) Foreign Application Priority Data

Jan. 23, 2007 (DE) .......................... 10 2007 003 444

(51) Int. Cl.
*G03B 27/42* (2006.01)
(52) U.S. Cl.
USPC ................... 355/53; 355/55; 355/63; 355/68; 355/77
(58) Field of Classification Search
USPC ................... 355/53, 55, 63, 68, 77; 356/121, 356/123
See application file for complete search history.

(56) References Cited

U.S. PATENT DOCUMENTS

| 5,666,206 A | 9/1997 | Uchiyama |
| 6,356,345 B1 | 3/2002 | McArthur et al. |
| 6,750,957 B1 | 6/2004 | Levecq et al. |

(Continued)

FOREIGN PATENT DOCUMENTS

| DE | 197 05 119 A1 | 8/1998 |
| DE | 198 41 083 A1 | 4/2000 |

(Continued)

OTHER PUBLICATIONS

Neal, Daniel et al., "Amplitute and phase beam characterization using a two-dimensional wavefront sensor", Proc. SPIE vol. 2870, p. 72-82.

*Primary Examiner* — Steven H. Whitesell Gordon
*Assistant Examiner* — Mesfin T Asfaw
(74) *Attorney, Agent, or Firm* — Sughrue Mion, PLLC

(57) ABSTRACT

A projection exposure tool (10) for microlithography with a measuring apparatus (36) disposed in an optical path (28) of the projection exposure tool (10) for the locally and angularly resolved measurement of an irradiation strength distribution. The measuring apparatus (36) includes a measuring field with an arrangement (56) of focusing optical elements (42) disposed at respective individual points of the measuring field (41), a common image plane (44) for the focusing optical elements (42), a locally resolving radiation detector (46) with a recording surface (48) for the locally resolved recording of a radiation intensity, the recording surface (48) being disposed in the common image plane (44), and the radiation detector outputting radiation intensity signals for a plurality of angle values indicative of a respective angularly resolved irradiation strength distribution for at least one of the individual measuring field points.

21 Claims, 11 Drawing Sheets

(56) References Cited

U.S. PATENT DOCUMENTS

| | | |
|---|---|---|
| 7,088,427 B2 | 8/2006 | Smith et al. |
| 2002/0085286 A1 | 7/2002 | Drodofsky et al. |
| 2002/0159048 A1 | 10/2002 | Inoue et al. |
| 2003/0137654 A1 | 7/2003 | Mizuno |
| 2004/0114123 A1 | 6/2004 | Mulder et al. |
| 2004/0227932 A1 | 11/2004 | Yoon |
| 2005/0157384 A1 | 7/2005 | Shiraishi et al. |
| 2005/0231705 A1 | 10/2005 | Smith et al. |
| 2005/0264827 A1* | 12/2005 | Schriever et al. ............. 356/509 |
| 2007/0046921 A1* | 3/2007 | Takahashi et al. ............. 355/71 |
| 2008/0043236 A1 | 2/2008 | Kaise et al. |

FOREIGN PATENT DOCUMENTS

| | | |
|---|---|---|
| EP | 1 189 112 A2 | 3/2002 |
| EP | 1 355 140 A1 | 10/2003 |
| JP | 08227844 A | 9/1996 |
| JP | 2003 100613 | 4/2003 |
| JP | 2004014764 A | 1/2004 |
| JP | 2005 098933 | 4/2005 |
| JP | 2006 032692 | 2/2006 |
| WO | 2006016584 A1 | 2/2006 |
| WO | 2006133907 A2 | 12/2006 |

\* cited by examiner

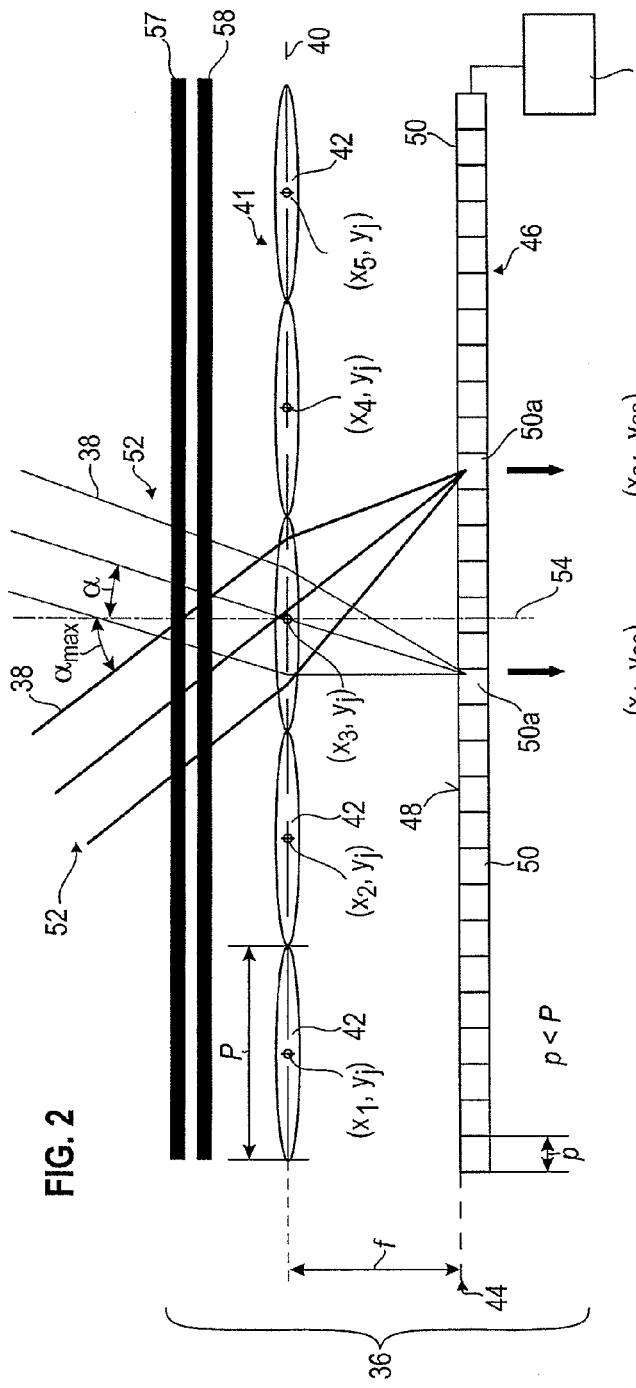
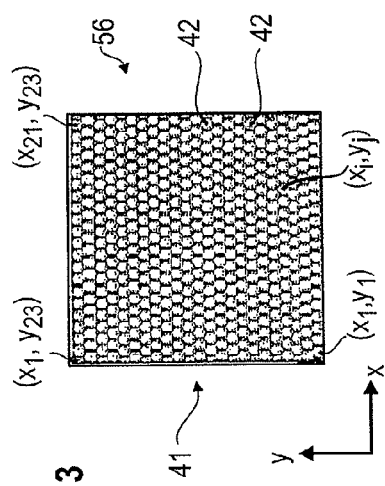
FIG. 2
FIG. 3

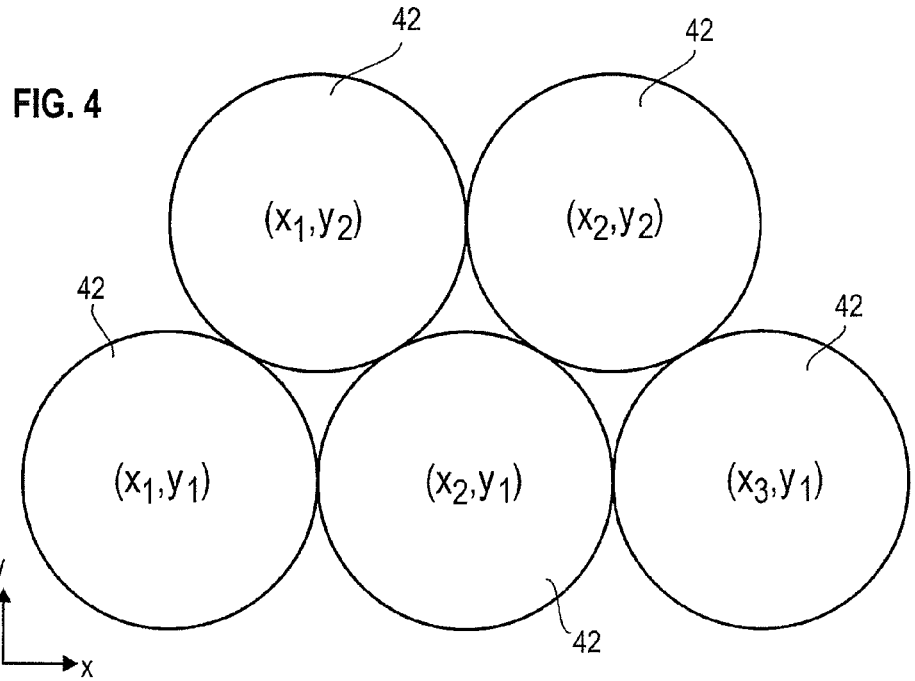
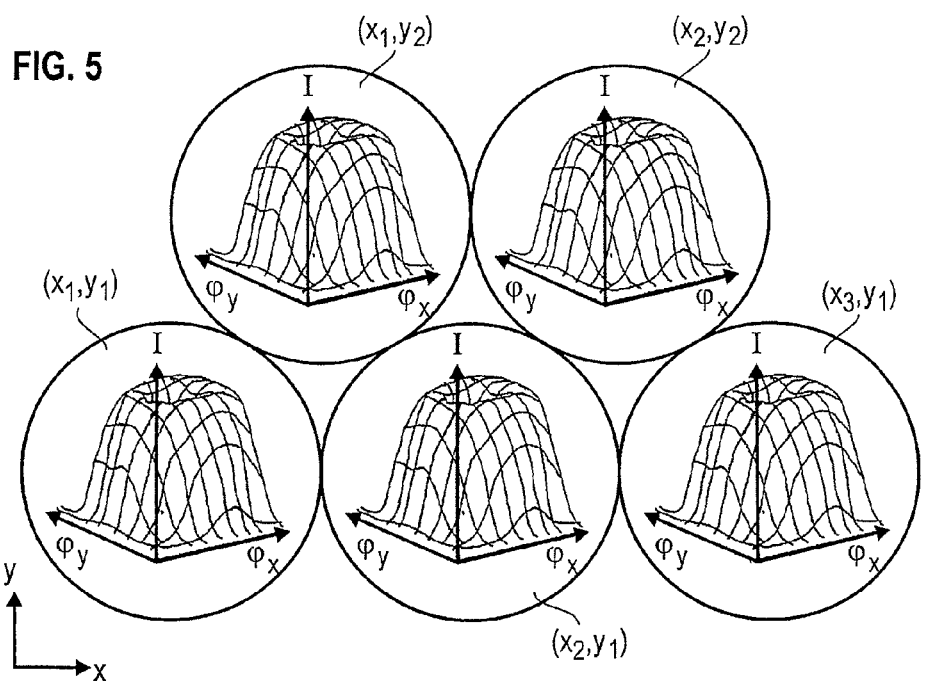

P = 0,25 mm f = 0,8 mm

PROJECTION EXPOSURE TOOL FOR MICROLITHOGRAPHY WITH A MEASURING APPARATUS AND METHOD FOR MEASURING AN IRRADIATION STRENGTH DISTRIBUTION

This is a Continuation of International Application PCT/EP2008/000253, with an international filing date of Jan. 15, 2008, which was published under PCT Article 21(2) in English, and the complete disclosure of which is incorporated into this application by reference.

BACKGROUND OF THE INVENTION

The invention relates to a projection exposure tool for microlithography with a measuring apparatus disposed in an optical path of the projection exposure tool. Furthermore, the invention relates to a method for measuring an irradiation strength distribution in the optical path of a projection exposure tool for microlithography.

A projection exposure tool for microlithography generally includes several optical sub-systems. These include an illumination system for illuminating a reticle carrying a structured lithography mask and a projection objective for imaging the lithography mask onto a semiconductor wafer. The illumination system has a light source, for example a laser in the UV wavelength range and a REMA objective for imaging a reticle masking device (REMA) into the reticle plane of the projection exposure tool. Therefore, the optical path of the electromagnetic radiation produced by the light source typically passes through the REMA objective, the reticle and the projection objective.

In order to measure the course of the electromagnetic radiation in the optical path of the projection exposure tool, in the prior art, cameras are positioned at points in the optical path which are accessible for this. These cameras enable locally resolved measurement of the intensity distribution of the electromagnetic radiation prevailing at the location of the camera. However, the information thus obtained regarding the course of the electromagnetic radiation is often insufficient for the optimum coordination or adjustment of the optical sub-systems.

OBJECTS OF THE INVENTION

It is one object of the invention to provide a projection exposure tool and a method with which the aforementioned disadvantages can be overcome, and in particular the course of the electromagnetic radiation in the optical path of the projection exposure tool can be determined more precisely and more extensively.

SUMMARY OF THE INVENTION

According to one formulation of the invention, a projection exposure tool for microlithography with a measuring apparatus disposed in an optical path of the projection exposure tool for the locally and angularly resolved measurement of an irradiation strength distribution is provided. The measuring apparatus includes: a measuring field with an arrangement of focusing optical elements disposed at respective individual points of the measuring field, a common image plane for the focusing optical elements, and a locally resolving radiation detector with a recording surface for the locally resolved recording of a radiation intensity, the recording surface being disposed in the common image plane, and the radiation detector outputting radiation intensity signals for a plurality of angle values indicative of a respective angularly resolved irradiation strength distribution for at least one of the individual measuring field points. Furthermore, according to the invention a method for measuring an irradiation strength distribution in the optical path of a projection exposure tool for microlithography is provided, which method includes: arranging focusing optical elements at individual points of a measuring field in the optical path of the projection exposure tool such that the focusing optical elements have a common image plane, arranging a locally resolving radiation detector such that a recording surface of the radiation detector lies in the common image plane, locally resolved recording of respective intensities of electromagnetic radiation reaching the radiation detector, and establishing a respective angularly resolved irradiation strength distribution for at least one of the individual measuring field points of a plurality of field points from the recorded radiation intensities. Such a measuring apparatus can be used for the respective angularly resolved measurement of an irradiation strength distribution at individual points of a measuring field in the optical path of a projection exposure tool for microlithography. Another use of such a measuring apparatus is the locally and angularly resolved measurement of an irradiation strength distribution for determining diffraction efficiencies of a lithography mask.

In other words, according to the invention a projection exposure tool for microlithography, such as for example a stepper or scanner, is provided with a measuring apparatus which is disposed in the optical path of the projection exposure tool both for the locally and for the angularly resolved measurement of an irradiation strength distribution. Therefore, an irradiation strength distribution over a measuring field in the optical path can be measured by the measuring apparatus, and so the distribution of the radiation flow of the electromagnetic radiation is angularly resolved over the measuring surface. Here, for any or all of the individual measuring field points, a respective extended, angularly resolved irradiation strength distribution is established. Therefore, for any or each measuring field point, not just one angular value is established, as is the case for example with a wave front measurement. Rather, for any or each measuring field point, irradiation strengths are established over an angle spectrum, i.e. irradiation intensities are established at any or each individual measuring field point for at least two, and in particular three, four, five or more, different radiation angles.

In particular, sections of the recording surface of the locally resolving radiation detector assigned to individual focusing elements are respectively irradiated during the measurement according to the invention with an extended local radiation distribution, unlike the radiation distribution of a point image. The extent of the radiation distribution in the respective sections of the recording surface of the locally resolving radiation detector assigned to the individual focusing elements is in particular at least twice, and preferably between ten and a hundred times as large as the extent of the Airy disc formed on a corresponding detector section during a wavefront measurement by a Shack Hartmann sensor.

In accordance with the invention, a measuring field point is to be understood as meaning a specific location in the measuring field of the measuring apparatus, and not for example an object field point on the reticle or an image field point on the wafer.

The electromagnetic radiation carried in the optical path of the projection exposure tool can, depending on the type of the projection exposure tool, lie in the UV wavelength range, such as for example in the 365 nm, 248 nm, 193 nm or 157 nm wavelength range, or be for example EUV radiation, in particular radiation with a wavelength of 13.4 nm.

The measuring apparatus for the locally and angularly resolved measurement of the irradiation strength distribution includes several focusing optical elements, i.e. optical elements which have a focusing effect upon arriving electromagnetic radiation. The focusing optical elements respectively have a focus or image plane. The focusing optical elements are arranged such that the respective image planes of the optical elements coincide, i.e. there is a common image plane or focus plane for the focusing optical elements. Advantageously, the optical elements are disposed, offset in relation to one another, laterally to the optical axis of one of the optical elements, and are located in particular in a plane parallel to the common image plane. The locally resolving radiation detector is disposed with its recording surface in the common image plane, and records the intensity of the electromagnetic radiation arriving in the recording surface, locally resolved. By arranging the recording surface in the common image plane, and not for example in a conjugated image plane, no additional optics imaging the image plane onto another plane, such as for example a conjugated image plane, are disposed between the focusing optical elements and the radiation detector. The measuring precision of the measuring apparatus is thus increased.

The invention is associated with the insight that, by locally resolved recording of the intensity of the arriving electromagnetic radiation in the common image plane of the focusing optical elements for each individual measuring field point, a respective angularly resolved irradiation strength distribution can be established with regard to the electromagnetic radiation in the optical path. The locally and angularly resolved irradiation strength distribution can therefore be measured at different points in the optical path of the projection exposure tool, by which the course of the electromagnetic radiation in the optical path of the projection exposure tool can be extensively determined. This in turn enables very precise coordination of individual optical elements of the projection exposure tool, and so an optimization of the course of radiation in the optical path.

Therefore, the locally and angularly resolved measurement of the irradiation strength distribution enables improved adjustment of the optical elements of the projection exposure tool both when assembling the projection exposure tool and during maintenance work on the projection exposure tool. It is also possible to monitor the irradiation strength distribution continuously at specific locations in the optical path during operation of the projection exposure tool using the measuring apparatus according to the invention.

According to certain embodiments, an evaluation device is set up to establish a so-called "pole balancing" of the radiation strength distribution in the measuring field, in particular separately for each measuring field point. The term "pole balancing" is known to the skilled person e.g. with respect to the angular distribution of the radiation in the reticle plane of a projection exposure tool. In case of dipole illumination, quadrupole illumination or illumination of a different pole configuration a determination of "pole balancing" includes an establishment of the relative intensity ratios in the various poles with respect to each other. It is to be understood, that the term "pole balancing" as used in this application is not to be limited to a measurement in the reticle plane, but analogously applies to measurements at various locations in the optical path of the projection exposure tool.

According to some embodiments, the evaluation device is set up to measure the "real setting" of a projection exposure tool. As known to the skilled person the "setting" of a projection exposure tool generally refers to the angular distribution of the radiation irradiating the reticle plane at the individual locations of the reticle plane. When determining the "real setting" the angular distribution at the various locations of the reticle plane is determined for the actual operation of the projection exposure tool, which typically varies from the "design settting", i.e. the angular distribution exhibited by the projection exposure tool by design. As with the term "pole balancing", the term "real sefting" as used in this application is not to be limited to a measurement in the reticle plane, but applies analogously to measurements at various locations in the optical path of the projection exposure tool.

In one embodiment according to the invention, the focusing optical elements and the radiation detector are integrated into a separate module. A separate module is understood as meaning that the module is designed independently of other sub-systems of the projection exposure tool. In particular, no other optical elements of sub-systems of the projection exposure tool, such as for example optical elements of the illumination system or of the projection optics, are contained in the module. By integrating the focusing optical elements and the radiation detector into a separate module, the manageability of the measuring apparatus is increased. Therefore, the measuring apparatus can be disposed without greater complexity at different locations in the optical path of the projection exposure tool. Furthermore, measurement inaccuracies caused by other optical elements are prevented.

In a further embodiment according to the invention, the local resolution of the radiation detector is greater than the extent of individual focusing optical elements. Therefore, the radiation detector is capable of resolving dimensions which are smaller than the extent of individual focusing optical elements. If for example the radiation detector is in the form of a CCD camera, several image elements (pixels) or detector elements of the CCD camera correspond to the extent of a focusing optical element. Using the high local resolution of the radiation detector, a plurality of detector elements are respectively assigned to a specific focusing optical element. Therefore, an intensity recorded on a specific detector element of the radiation detector can be clearly assigned to a specific focusing optical element. This enables the angularly resolved determination of the irradiation strength distribution with a high degree of precision.

In a further embodiment according to the invention, the locally resolving radiation detector has a photoelectric device, in particular a CCD camera, a photodiode grid and a photodiode line, respectively, and/or a fluorescence layer with a photoelectric image recording device. This type of image recording device can once again be e.g. a CCD detector. A combination of this type of image recording device with a fluorescence layer is particularly advantageous for use in the EUV wavelength range. P43 of the company ASP can for example be used as the fluorescence layer. The use of a fluorescence layer with an image recording device enables high local resolution in the detector plane, dependently upon the layer grain size, the fluorescence layer and the resolution of the image recording device. A so-called "back-illuminated CCD camera" can also be used as a radiation detector for EUV radiation. Advantageously a CCD camera serving as a radiation detector has a typical detector element or image element distance of 10 μm. With an extent of the focusing optical element, such as for example a refractive microlens, of 0.25 mm, then at least 25 radiation-sensitive detector or grid elements are ordered in a spatial direction beneath each focusing optical element. High angular resolution is thus made possible.

In a further embodiment according to the invention, the measuring apparatus is set up to measure the irradiation strength distribution at each measuring point, two-dimensionally angularly resolved. Therefore, a respective two-dimensional locally and angularly resolved measurement can take place. The radiation strength is then measured four-dimensionally. This enables detailed determination of the radiation course in the optical path of the projection exposure tool.

Furthermore, it is advantageous if the focusing optical elements are arranged in the form of a grid in a measuring plane. Using the grid-type arrangement of the optical elements, the measuring field can be covered evenly with the optical elements. Therefore, the irradiation strength distribution can be measured with high local resolution over the whole grid region. Using the grid-type arrangement of the focusing optical elements, the measuring plane can be covered with optical elements with as few gaps as possible. It is thus ensured that no gaps occur when measuring the irradiation strength distribution.

In a further advantageous embodiment, at least one of the focusing optical elements has a refractive microlens, in particular with a minimum diameter of 0.25 mm, a diffractive microlens, in particular with a minimum diameter of 0.2 mm, and/or a microlens with a pinhole disposed in front of it, in particular with an opening diameter of less than 0.1 mm. The aforementioned microlenses can be made in particular of quartz glass. Therefore, they are in particular permeable to light with a wavelength of 248 nm and 193 nm. A diffractive microlens can for example be in the form of a CGH (Computer Generated Hologram). A pinhole applied in front of the microlens can serve to precisely define the inlet aperture of the microlens. It is particularly advantageous to dispose a hexagonally densely packed microlens array with a lens distance of for example 250 µm and a lens diameter of e.g. 240 µm in the measuring plane. Moreover, it is advantageous if at least one of the focusing optical elements includes a Fresnel zone plate. A Fresnel zone plate is particularly suitable here for focusing EUV radiation. Fresnel zone plates can be in the form for example of chrome rings or of blazed grids.

Moreover, it is advantageous if a pinhole grid with several openings forming the focusing optical elements is provided. In this case one can dispense with refractive or diffractive microlenses. As already mentioned, in this case the focusing optical elements are formed by the pinholes. The focusing effect of the pinholes arises from the effects of diffraction. The provision of a pinhole grid according to this advantageous embodiment is suitable in particular for measuring the irradiation strength distribution in a projection exposure tool operated in the EUV wavelength range. An advantageous measurement for the hole diameter here is approximately 4 µm. The distance between the pinhole grid and the recording surface is advantageously approximately 1 mm. With a wavelength of approximately 13 nm this results in a minimum spot diameter of approximately 8 µm.

Furthermore, it is advantageous if the projection exposure tool has an illumination device for emitting the electromagnetic radiation with a specific wavelength, and the openings of the pinhole grid respectively have a diameter which is at least twice, and in particular 10 to 100 times as large as the wavelength of the electromagnetic radiation. In particular for wavelengths in the EUV range, particularly precise measurement results for the irradiation strength distribution can thus be achieved.

Furthermore, it is advantageous if the measuring apparatus further includes a polarizing filter and/or the radiation detector is designed to be polarization-selective. Therefore, the irradiation strength distribution can be measured dependently upon the polarization of the radiated electromagnetic radiation. The polarization filter is advantageously disposed in the optical path in front of the focusing optical elements.

Moreover, it is advantageous if the measuring apparatus further includes a color or spectral filter and/or the radiation detector is designed to be spectral-selective. This makes it possible to determine the irradiation strength distribution wavelength-resolved. Advantageously the color filter is disposed in the optical path in front of the focusing optical elements.

In a further advantageous embodiment, the optical path includes a bundle of individual rays, at the location of the optical elements the individual rays have a maximum angular deviation $\alpha_{max}$ in relation to the respective optical axes of the optical elements, and the optical elements have respective diameters P and respective focal lengths f which conform to the following relation: $P/(2f) > \tan(\alpha_{max})$. Therefore the assignment of an individual detector element of the radiation detector to the respective focusing optical element remains possible. This means that the individual detector elements of the radiation detector or the detector elements have a clear assignment to the respective focusing optical elements to the effect that a radiation intensity measured with a specific detector element can be reliably traced back to an individual ray which has passed through the assigned focusing optical element. The diameter P of the optical elements relates to the diameter of the respective optical element at right angles to the optical axis of the respective optical element. In an advantageous dimensioning example, the diameter P=0.25 mm and the focal length f=0.8 mm, from which a maximum angular deviation $\alpha_{max}$ of 9° results. With a resolution of the radiation detector of 0.01 m this results in an angular resolution of 0.7° or 12 mrad. In further advantageous dimensioning, the diameter P=0.25 mm, the focal length f=20 mm, from which a maximum angular deviation $\alpha_{max}$ of 0.36° results. With a resolution of the radiation detector once again of 0.01 mm, this results in an angular resolution of 0.03° or 0.5 mrad.

In a further advantageous embodiment, the measuring apparatus further includes a shielding element, in particular a hole grid mask and/or a surface light modulator for shielding individual focusing optical elements from irradiation by the electromagnetic radiation in the optical path. Using the shielding elements, individual focusing optical elements are masked, and preferably every other focusing optical element is masked by this type of shielding element. For this purpose the corresponding shielding element is advantageously disposed directly in front of the respective focusing optical element. With advantageous masking of every other focusing optical element in both dimensions of the measuring plane, all adjacent optical elements of a non-shielded optical element of the radiation in the optical path are shielded. Since therefore the detector elements actually assigned to the shielded optical elements are not irradiated by these optical elements, the maximum angle of incidence for the radiation hitting the non-shielded optical element can be increased. This means that the maximum angle region with which the incident irradiation intensity can be recorded with an adjacent, non-shielded optical element without crosstalk is increased.

In a further embodiment according to the invention, the measuring apparatus is disposed in a measuring plane, and the evaluation device is set up to establish the irradiation strength distribution in the measuring plane and from this to calculate by ray optics an irradiation strength distribution in a target plane offset in relation to the measuring plane. This makes it possible to establish the irradiation strength distribution in a measuring plane of the projection exposure tool which is inaccessible for the measuring plane.

In a further embodiment according to the invention, the projection exposure tool has a REMA objective with an assigned pupil plane, a reticle masking device disposed in an aperture plane, a reticle plane, a projection objective with an assigned pupil plane, and a wafer plane, and the target plane is disposed between two of these planes, selected from the pupil plane of the REMA objective, the aperture plane, the reticle plane, the pupil plane of the projection objective and the wafer plane.

Moreover, it is advantageous if the measuring apparatus furthermore has a first movement device for moving the radiation detector in the common image plane. Therefore, when recording the intensity of the electromagnetic radiation reaching the radiation detector, the radiation detector can be moved. Advantageously, the local resolution of the radiation detector is pixel-limited, and the first movement device is designed to move the radiation detector two-dimensionally during recording of the radiation reaching the radiation detector by up to ±1 pixel width of the radiation detector. Advantageously, the measuring apparatus further includes an evaluation device which is designed to push back and average the images recorded mathematically, and to establish the spot center points of the individual ray bundles hitting the recording surface of the detector using the focusing optical elements. This method is also called "dithering". Therefore, the irradiation strength distribution can be established with improved angular resolution. For example, with this method, the spot center point with a wavelength of 193 nm can be established with 0.5 µm precision. The spot diameter with this wavelength is ideally 2 µm, but in practice this is increased by aberrations and is for example approx. 5 µm.

Furthermore, it is advantageous if a second movement device for moving the measuring apparatus in the optical path of the projection exposure tool is provided. Advantageously the second movement device is set up to move the measuring apparatus laterally in relation to the propagation direction of the radiation in the optical path of the projection exposure tool. Therefore, a larger radiation diameter can be measured by bringing together measurement results from high local resolution. This measuring method corresponds to a combination of a parallel and a serial measurement. Therefore, measurement of optical paths, the cross-sections of which are larger than the extent of the measuring apparatus thus becomes possible. In a further advantageous embodiment the second movement device is set up to move the measuring apparatus parallel to the propagation direction of the radiation. Therefore the radiation field can be sampled spatially, i.e. three-dimensionally.

Moreover, it is advantageous if the measuring apparatus has several arrays of focusing optical elements adjacent to one another and/or a plurality of locally resolving individual detector arrays adjacent to one another. In particular, the measuring apparatus can have several microlens arrays in a plane and several CCD cameras assigned to the individual microlens arrays in the common focus plane. With this advantageous embodiment too, optical paths with a large diameter can be measured with high local resolution.

Furthermore, the aforementioned object is achieved according to the invention with a projection exposure tool for microlithography, in particular designed according to any of the previously described embodiments, with a reticle plane for positioning a reticle carrying a structured lithography mask and a measuring apparatus for the locally and angularly resolved measurement of an irradiation strength distribution, the measuring apparatus including: an arrangement of focusing optical elements, a common image plane for the focusing optical elements, and a locally resolving radiation detector with a recording surface disposed in the common image plane for the locally resolved recording of a radiation intensity, the measuring apparatus being disposed in the region of a reticle plane. In particular, the focusing optical elements are disposed in the reticle plane. Furthermore, according to the invention, a method for measuring an irradiation strength distribution is provided in the region of a reticle plane of a projection exposure tool for microlithography. The method according to the invention includes: arranging focusing optical elements in the region of the reticle plane, in particular in the reticle plane, such that the focusing optical elements have a common image plane, arranging a locally resolving radiation detector such that the recording surface of the radiation detector lies in the common image plane, and locally resolved recording of the intensity of electromagnetic radiation reaching the radiation detector.

During operation of the projection exposure tool, a reticle is disposed in the reticle plane, and the structures located on the reticle are imaged by the projection optics of the exposure tool onto a wafer. For the precise imaging of the smallest of structures onto the wafer it is important for the illumination of the lithography mask carrying the structures to be imaged to be homogeneous over the whole mask. The measuring apparatus disposed in the region of the reticle plane makes it possible to measure the illumination homogeneity in the reticle plane with a high degree of precision both locally resolved and angularly resolved. These measurements can be implemented for example between the exposure of individual wafers. The illumination homogeneity can be measured particularly precisely in the reticle plane if the focusing optical elements of the measuring apparatus are disposed in the reticle plane.

Furthermore, the aforementioned object is achieved according to the invention with a projection exposure tool for microlithography, in particular designed according to any of the previously described embodiments, with a projection objective for imaging a structured lithography mask onto a wafer and a measuring apparatus for the locally and angularly resolved measurement of an irradiation strength distribution, the measuring apparatus comprising: an arrangement of focusing optical elements, a common image plane for the focusing optical elements, and a locally resolving radiation detector with a recording surface disposed in the common image plane for the locally resolved recording of a radiation intensity, the measuring apparatus being disposed in the region of a pupil plane of the projection objective. In particular, the focusing optical elements are disposed in the pupil plane of the projection objective. Furthermore, according to the invention, a method for measuring an irradiation strength distribution in the region of a pupil plane of a projection objective of a projection exposure tool for microlithography is provided. The method according to the invention includes: arranging focusing optical elements in the region of the pupil plane of the projection objective, in particular in the pupil plane, such that the focusing optical elements have a common image plane, arranging a locally resolving radiation detector such that the recording surface of the radiation detector lies in the common image plane, and locally resolved recording of the intensity of electromagnetic radiation reaching the radiation detector.

Therefore, the irradiation strength distribution in the pupil plane of the projection objective can be measured locally and angularly resolved. This information enables highly precise adjustment of the individual optical elements of the projection exposure tool, and so an improvement of the imaging characteristics of the projection exposure tool. Advantageously, the projection objective has a change-over mount, in order to insert the measuring apparatus into the pupil plane.

The aforementioned object is further achieved according to the invention with a projection exposure tool for microlithography, in particular designed according to any of the previously described embodiments, with a REMA objective for imaging a reticle masking device into a reticle plane of the projection exposure tool and a measuring apparatus for the locally and angularly resolved measurement of an irradiation strength distribution, the measuring apparatus including: an arrangement of focusing optical elements, a common image plane for the focusing optical elements, and a locally resolving radiation detector with a recording surface disposed in the common image plane for the locally resolved recording of a radiation intensity, and the measuring apparatus being disposed in the region of a pupil plane of the REMA objective. In particular the focusing optical elements are disposed in the pupil plane of the REMA objective. Furthermore, according to the invention, a method is provided for measuring an irradiation strength distribution in the region of a pupil plane of a REMA objective of a projection exposure tool for microlithography. The method according to the invention includes: arranging focusing optical elements in the region of the pupil plane of the REMA objective, in particular in the pupil plane, such that the focusing optical elements have a common image plane, arranging a locally resolving radiation detector such that the recording surface of the recording detector lies in the common image plane, and locally resolved recording of the intensity of electromagnetic radiation reaching the radiation detector.

Normally the reticle masking device is designed with adjustable apertures. Disposed in the reticle plane is a reticle which carries the structured mask for lithography. The reticle masking device ensures that only the part of the reticle to be exposed during operation of the projection exposure tool is exposed. As is known to the person skilled in the art, a pupil of an objective is generally understood as meaning the outlet pupil, and therefore the image of the aperture diaphragm, as seen from an axial point of the image plane through the lenses lying between the latter, or the aperture diaphragm itself. The positioning of the measuring apparatus in the region of the pupil plane of the REMA objective enables precise measuring of the course of radiation through the REMA objective, and so optimal adjustment of the individual optical elements of the REMA objective.

Furthermore, the aforementioned object is achieved according to the invention with a projection exposure tool for microlithography, in particular designed according to any of the previously described embodiments, with a reticle masking device disposed in an aperture plane and a measuring apparatus for the locally and angularly resolved measurement of an irradiation strength distribution, the measuring apparatus including: an arrangement of focusing optical elements, a common image plane for the focusing optical elements, and a locally resolving radiation detector with a recording surface disposed in the common image plane for the locally resolved recording of a radiation intensity, and the measuring apparatus being disposed in the region of the aperture plane. In particular, the focusing optical elements are disposed in the aperture plane. Furthermore, according to the invention, a method is provided for measuring an irradiation strength distribution in the region of an aperture plane for a reticle masking device of a projection exposure tool for microlithography. The method according to the invention includes: arranging focusing optical elements in the region of the aperture plane, in particular in the aperture plane, such that the focusing optical elements have a common image plane, arranging a locally resolving radiation detector such that the recording surface of the Iradiation detector lies in the common image plane, and locally resolved recording of the intensity of electromagnetic radiation reaching the radiation detector.

As already mentioned above, the reticle masking device can be designed with apertures—so-called REMA blades. By positioning the measuring apparatus in the region of the aperture plane the irradiation strength distribution in the aperture plane can be measured, locally and angularly resolved, and so conclusions can be drawn regarding the illumination homogeneity of the reticle.

In a further embodiment according to the invention, the projection exposure tool has a wafer plane for positioning a wafer to be lithographically exposed, and the measuring apparatus is disposed in the region of the wafer plane. Therefore, the homogeneity of the lithographic imaging can be measured over the whole image field, locally and angularly resolved, and from the resulting information appropriate adjustments can be made in the optics of the projection exposure tool. Advantageously, the measuring apparatus is disposed in the region of the wafer plane such that the focusing optical elements lie in the wafer plane. According to an alternative embodiment, the measuring apparatus is disposed in the optical path of the projection exposure tool above the wafer plane, i.e. at a position closer to the illumination source of the exposure tool than the wafer plane.

According to a further embodiment according to the invention, a further measuring apparatus having the features of the aforementioned measuring apparatus is disposed in the region of the reticle plane. In a further embodiment according to the invention a further measuring apparatus having the features of the aforementioned measuring apparatus is disposed in the region of the pupil plane of the projection objective. Moreover, it is advantageous if a further measuring apparatus having the features of the aforementioned measuring apparatus is disposed in the region of the pupil plane of the REMA objective. In a further embodiment according to the invention, a further measuring apparatus having the features of the aforementioned measuring apparatus is disposed in the region of the pupil plane of the reticle masking device.

Therefore, according to the aforementioned embodiments according to the invention, at least two measuring apparatuses are disposed at different points in the optical path of the projection exposure tool. From the locally and angularly resolved measurement results at the different measuring planes in the optical path, conclusions can be drawn regarding error sources in the optical elements in the optical path. Furthermore, it is possible to determine the location of the error source in the optical path, at least roughly. If the measured irradiation strength distribution in a first measuring plane, e.g. the reticle plane, is within the expected standard, but however in a second measuring plane lying in the optical path behind the first measuring plane, such as e.g. the pupil plane of the projection optics, deviates from its desired distribution, the optical elements located between the two measuring planes can be identified as an error source.

A possible error source which can be established here is the existence of a diffused light source. Furthermore, according to the invention, a method is provided for identifying a diffused light source in the optical path of a projection exposure tool. The method includes: measuring an irradiation strength distribution with the measuring method in one of the preceding embodiments, with which the radiation detector is disposed in one of the aforementioned measuring planes in the optical path of the projection exposure tool, measuring an irradiation strength distribution with the measuring method of at least one further of the preceding embodiments with which the radiation detector is disposed in at least one other of the aforementioned measuring planes, and establishing the existence of a diffused light source in the optical path of the projection exposure tool by evaluating the measured irradiation strength distributions.

As already mentioned above, according to the invention, it is further proposed to use a measuring apparatus for the locally and angularly resolved measurement of an irradiation strength distribution for determining diffraction efficiencies of a lithography mask. The measuring apparatus used here includes an arrangement of focusing optical elements, a common image plane for the focusing optical elements, and a locally resolving radiation detector, the recording surface of which is disposed in the common image plane. For this purpose the lithography mask is advantageously illuminated with a high spatial coherence, i.e. with illumination radiation which comes from a uniform direction.

If the measuring apparatus is now disposed in the optical path of the illumination radiation beneath the lithography mask, the capability of the measuring apparatus to record the arriving illumination radiation angularly resolved, can be employed to record the zeroth diffraction order separately from the first diffraction order of the radiation passing through the lithography mask locally resolved over the whole lithography mask. From this, the diffraction efficiency of the lithography mask can then be determined, locally resolved. The diffraction efficiency is defined as the proportion of the intensity which goes in the first diffraction order.

Advantageously, the measuring apparatus has a suitable evaluation device with which the diffraction efficiencies can be established from the measured intensities. In a further advantageous embodiment the diffraction efficiencies of the lithography mask are measured with the lithography mask fitted in the projection exposure tool. For this purpose the measuring apparatus can be disposed for example in the wafer plane, but also in a plane above the projection optics.

The features specified in relation to the embodiments of the projection exposure tool according to the invention detailed above can be correspondingly transferred to the method according to the invention. The same applies vice versa—those relating to the embodiments of the method according to the invention detailed above can be correspondingly transferred to the projection exposure tool according to the invention. The embodiments and advantages of the measuring apparatus resulting from the advantageous embodiments of the projection exposure tool can also correspondingly be transferred to the use according to the invention of the measuring apparatus for determining diffraction efficiencies of a lithography mask or for the locally and angularly resolved measurement of an irradiation strength distribution. The specifics and advantages of the method according to the invention or of the uses according to the invention resulting from this are included by extension in the disclosure of the invention. Therefore, the advantages of the invention detailed in relation to the advantageous embodiments of the projection exposure tool according to the invention also apply to the corresponding advantageous embodiments of the method according to the invention or of the uses according to the invention and are thus disclosed by extension.

Stated in general terms, these and other features of embodiments of the invention are described in the claims as well as in the specification and the drawings. The individual features may be implemented either alone or in combination as embodiments of the invention, or may be implemented in other fields of application. Further, they may represent advantageous embodiments that are protectable in their own right, for which protection is claimed in the application as filed or for which protection will be claimed during pendency of this application and/or continuing applications.

BRIEF DESCRIPTION OF THE DRAWINGS

In the following, exemplary embodiments of a projection exposure tool according to the invention and of a method according to the invention for the locally and angularly resolved measurement of an irradiation strength distribution are described in greater detail with reference to the attached diagrammatic drawings. These show as follows.

DETAILED DESCRIPTION OF EXEMPLARY EMBODIMENTS ACCORDING TO THE INVENTION

In the exemplary embodiments described below elements which are functionally or structurally similar to one another are provided as far as possible with the same or similar reference numbers. Therefore, in order to fully appreciate the features of the individual elements of a specific exemplary embodiment, reference should be made to the description of other exemplary embodiments or to the general description of the invention.

Figure 1:
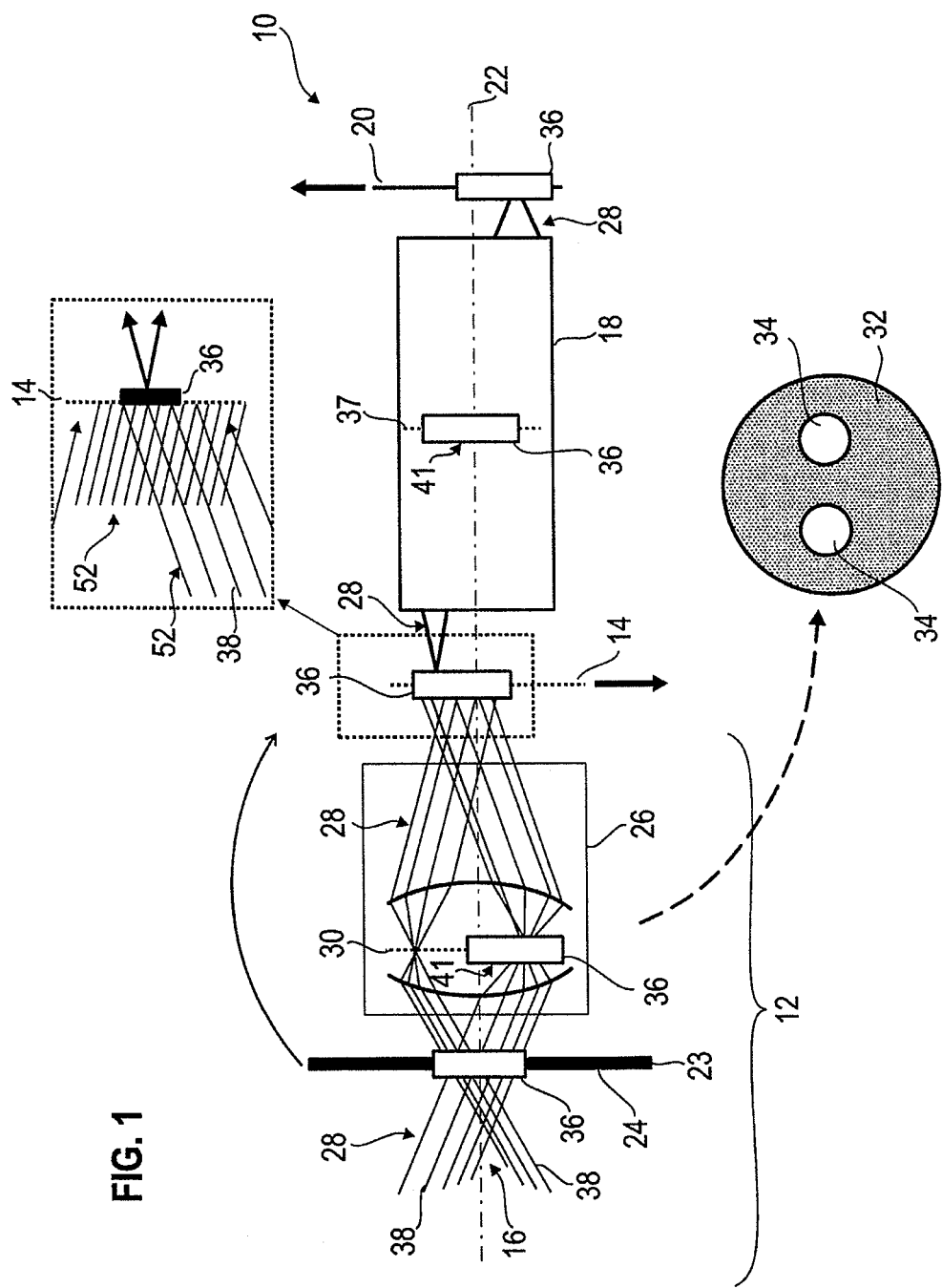
FIG. 1 an illustration of a design, in principle, of an embodiment of a projection exposure tool according to the invention with a measuring apparatus for the locally and angularly resolved measurement of an irradiation strength distribution, the measuring apparatus being drawn into the figure at different, exemplary points in the optical path of the projection exposure tool, FIG. 2 a diagrammatic side view of the design, in principle, of an embodiment of the measuring apparatus according to FIG. 1 with an arrangement according to the invention of the Imeasuring apparatus in the reticle plane of the projection exposure tool according to FIG. 1, FIG. 3 a top view of a measuring field of the measuring apparatus according to FIG. 2, FIG. 4 an enlarged section of a part of the measuring field according to FIG. 3, FIG. 5 an illustration, as an example, of angularly resolved irradiation strength distributions measured at individual points of the measuring field according to FIG. 4 with the measuring apparatus disposed in the reticle plane according to FIG. 2, FIG. 6 a diagrammatic side view of the design, in principle, of the measuring apparatus according to FIG. 2 with the measuring apparatus disposed in the pupil plane of the REMA objective or the pupil plane of the projection objective of the projection exposure tool according to FIG. 1, FIG. 7 an illustration, as an example, of angularly resolved irradiation strength distributions measured at individual points of the measuring field according to FIG. 4 with the measuring apparatus disposed in the pupil plane of the projection objective according to FIG. 6, FIG. 8 a diagrammatic side view of a further embodiment of the measuring apparatus according to FIG. 1, in the left part of the figure with the measuring apparatus disposed in the reticle plane of the projection exposure tool, and in the right part of the figure with the measuring apparatus disposed in a pupil plane of the projection exposure tool according to FIG. 1, FIG. 9 a diagrammatic side view of a further embodiment of the measuring apparatus according to FIG. 1 with a maximum angular resolution enlarged in relation to the measuring apparatus according to FIG. 2, FIG. 10 a diagrammatic side view of a use according to the invention of the measuring apparatus according to FIG. 2 for determining diffraction efficiencies of a lithography mask, FIG. 11 a diagrammatic side view of a further embodiment of a measuring apparatus according to FIG. 1 with the measuring apparatus disposed in the reticle plane of the projection exposure tool, FIG. 12 a diagrammatic side view of the measuring apparatus according to FIG. 11 with the measuring apparatus disposed in the wafer plane of the projection exposure tool according to FIG. 1, FIG. 13 a diagrammatic side view of a further embodiment of the measuring apparatus according to FIG. 2, FIG. 14 an illustration of the measuring apparatus according to FIG. 2 with a moveable arrangement according to the invention of the measuring apparatus in the optical path of the projection exposure tool according to FIG. 1, and FIG. 15 a side view of a further embodiment of the measuring apparatus according to FIG. 1.

FIG. 1 shows an exemplary embodiment of a projection exposure tool 10 according to the invention for microlithography in the form of a scanner. The projection exposure tool 10 includes an illumination system 12 for illuminating a reticle disposed in a reticle plane 14 of the projection exposure tool 10. The reticle is not shown in FIG. 1. The reticle is illuminated with electromagnetic radiation with a specific wavelength which, depending on the type of projection exposure tool 10, can be in the UV wavelength range or in the EUV wavelength range (extreme UV, for example 13.4 nm). In the UV wavelength range the wavelength can be for example 365 nm, 248 nm, 193 nm or 157 nm.

The projection exposure tool 10 further includes a projection objective 18 and a wafer plane 20. Mask structures in the reticle plane 14 are imaged by the projection objective 18 into the wafer plane 20. The illumination system 12 and the projection objective 18 have a common optical axis 22. The illumination system 12 includes a radiation source, not shown in the drawing, for example a laser for producing the electromagnetic radiation, and a reticle masking device (REMA) disposed in an aperture plane 23 for limiting an illuminated region in the reticle plane 14. For this purpose the reticle masking device has for example adjustable apertures, so-called REMA blades. Furthermore, the illumination system 12 includes a REMA objective 26 for imaging the reticle masking device 24 into the reticle plane 14.

Therefore, the optical path of the electromagnetic radiation 16 produced by the radiation source extends through the aperture plane 23, the REMA objective 26, the reticle plane 14 and the projection objective 18, and ends in the wafer plane 20. The REMA objective 26 has a pupil plane 30. The intensity distribution 32 or the locally resolved irradiation strength distribution in the pupil plane 30 is shown diagrammatically for a dipole illumination of the reticle plane 14 indicated for example in FIG. 1 in the lower region of FIG. 1. The intensity distribution 32 has two intensity maxima 34 here.

According to the invention a measuring apparatus 36 is disposed in the optical path 28 of the projection exposure tool 10 for the locally and angularly resolved measurement of an irradiation strength distribution. FIG. 1 shows as an example several possible positions where the measuring apparatus 36 can be disposed. Therefore, the measuring apparatus 36 can for example be disposed in the aperture plane 23, in the pupil plane 30 of the REMA objective 26, in the reticle plane 14, in a pupil plane 37 of the projection objective 18 and/or in the wafer plane 20.

When, for example, the measuring apparatus 36 is disposed in the pupil plane 30 of the REMA objective 26, individual rays 38 of the electromagnetic radiation 16 hit respective points of a measuring field 41 of the measuring apparatus 36 at different angles. The measuring apparatus 36 is set up to record the arriving electromagnetic radiation, angularly resolved, at different points of the measuring field, as described in greater detail below. This means that for each individual point in the measuring field 41, an angularly resolved irradiation strength distribution is established. Therefore, it is possible to determine the radiation intensities radiated onto the respective points in the pupil plane 30 at different angles. In the upper section of FIG. 1 the individual rays 38 of electromagnetic radiation 16 hitting a measuring apparatus 36 disposed in the reticle plane 14 are shown.

FIG. 2 shows an exemplary embodiment of the measuring apparatus 36 in detail. This embodiment of the measuring apparatus 36 has in a measuring plane 40 the measuring field 41 with an arrangement of focusing optical elements 42. In the case illustrated the focusing optical elements 42 are in the form of a microlens grid. Here the focusing optical elements 42 are designed as refractive microlenses. However, the focusing optical elements 42 can also be designed as diffractive microlenses, for example in the form of CGHs (Computer Generated Holograms). The focusing optical elements 42 have a uniform focal length f and so a common image plane 44 and a common focus plane.

Furthermore, the measuring apparatus 36 has a locally resolving radiation detector 46 disposed in the common image plane 44 in the form of a CCD camera or of a two-dimensional photodiode grid. The locally resolving radiation detector 46 has a recording surface 48 facing towards the focusing optical elements 42. The recording surface 48 is disposed here in the common image plane 44 of the focusing optical elements 42. The locally resolving radiation detector 46 has a plurality of detector elements 50 with a respective extent p in a direction parallel to the recording surface 48. Therefore the extent p defines the local resolution of the radiation detector 46.

Electromagnetic radiation 16 reaching the measuring field 41 of the measuring apparatus 36, which is called incident radiation 52 here, is focused by the focusing optical elements 42 onto the recording surface 48 of the radiation detector 46. Here, all of the individual rays 38 of the incident radiation 52, which have the same angle a with respect to the optical axis 54 of the illuminated optical element 42 in question, are focused onto a specific detector element 50. The radiation intensity arriving at a detector element 50a illuminated in this way is registered by the radiation detector 46.

An evaluation device 60 is used to reconstruct the locally and angularly resolved irradiation strength distribution in the measuring plane 40 of the measuring apparatus 36 from the local distribution of the registered intensity on the recording surface 48 of the radiation detector 46. For this purpose the detector elements 50 respectively lying directly beneath corresponding focusing optical elements 42 are assigned to the respective optical elements 42. So that no "crosstalk" occurs, i.e. the case does not arise where incident radiation 52 passing through a specific focusing optical element 42 reaches a detector element 50 assigned to an adjacent focusing element 42, the maximum angle of incidence $\alpha_{max}$ of the incident radiation 52 is limited such that the following relation applies:

$$P/(2f) > \tan(\alpha_{max}), \qquad (1)$$

P being the diameter and f being the focal length of the focusing optical elements 42.

Therefore, from the intensity distribution recorded by the radiation detector 46, the irradiation strength distribution in the measuring field 41 of the measuring apparatus 36 can be respectively determined, two-dimensionally locally and angularly resolved. The local resolution is limited by the diameter P of the focusing optical elements 42. The local assignment of radiation which has passed through a specific focusing optical element 42 takes place using the center point of the corresponding focusing optical element 42. The measuring apparatus 36 in the embodiment according to FIG. 2 and embodiments described at a later stage optionally include a polarization filter 57 and/or a spectral filter 58. Therefore the irradiation strength distribution can be determined, polarization-resolved and wavelength-resolved. Alternatively, the radiation detector 46 can also be designed to be polarization-selective or wavelength-selective.

When using a refractive microlens as a focusing optical element 42, a typical diameter for the microlens of 0.25 mm or more is chosen. If the focusing optical element 42 is formed with a diffractive microlens, the typical diameter of the microlens is 0.2 mm or more. The typical grid element size of the locally resolving radiation detector 46 in the form of a CCD camera is approximately 10 µm. With a combination of a refractive microlens with a typical diameter of 0.25 mm and a CCD camera with a typical grid element size of 10 µm as the radiation detector 46, at least 500 detector elements 50 lie under each microlens. Therefore, a high angular resolution is achieved.

FIG. 3 shows a top view of the measuring field 41 of the measuring apparatus 36 according to FIG. 2 with a grid 56 of the focusing optical elements 42. The focusing optical elements 42 are disposed at respective measuring field points $(x_i, y_j)$. FIG. 2 shows a horizontal line of these measuring field points $(x_{1-5}, y_j)$. FIG. 4 shows an enlarged section of a part of the measuring field 41 according to FIG. 3. FIG. 5 illustrates, as an example, the irradiation strength distributions measured with the measuring apparatus 36 according to the invention. For each measuring field point $(x_i, y_j)$ in the two-dimensional measuring field 41 an extended two-dimensional angularly resolved irradiation strength distribution $I(\phi_x, \phi_y)$ is established, i.e. for each of the measuring field points $(x_i, y_j)$ irradiation strength values are established for a plurality of angle values $\phi_x$ and $\phi_y$ in two angular dimensions. Therefore, overall a 4-dimensional irradiation strength distribution can be established. Alternatively, for each measuring field point $(x_i, y_j)$ a one-dimensional extended angularly resolved irradiation strength distribution can also be established.

In FIG. 5 exemplary measurement results are shown for the measuring apparatus 36 disposed in the reticle plane 14 of the projection exposure tool 10. Here there is a so-called annular illumination of the reticle. The irradiation strength distribution $I(\phi_x, \phi_y)$ varies slightly in practice from measuring field point to measuring field point. From the measured variation correction measures can be taken in the illumination system.

Figure 6:
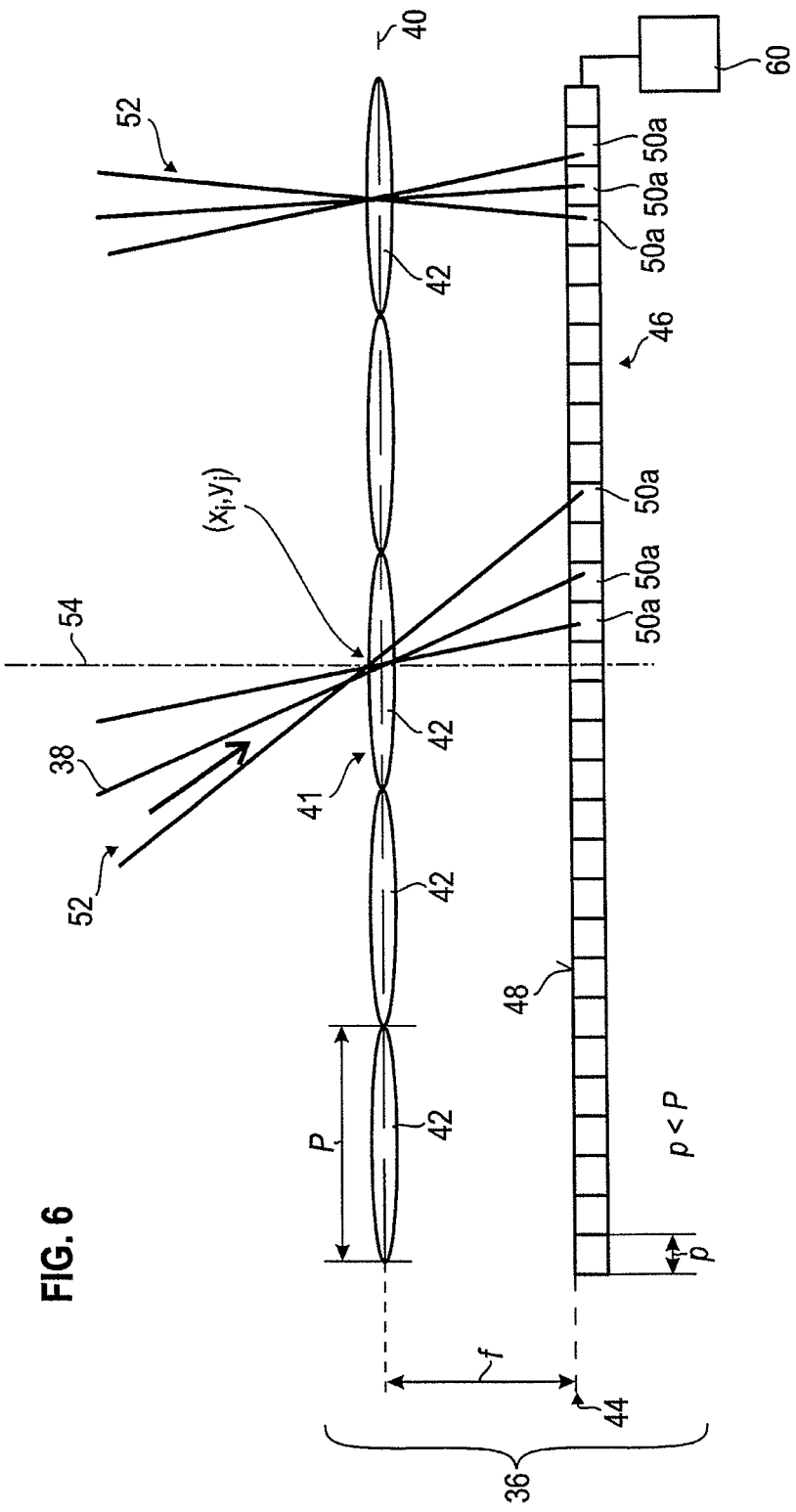

FIG. 6 shows the measuring apparatus 36 when disposed in the pupil plane 30 or 37 of the REMA objective 26 or of the projection objective 18. The incident radiation 52 contains individual rays 38 with many different directions. Therefore, as in the measuring situation according to FIG. 2, a plurality of detector elements 50a of a corresponding focusing optical element 42 are illuminated. The measuring apparatus 36 shown in FIG. 6 can also optionally have a polarization filter 57 and/or a spectral filter 58.

Figure 7:
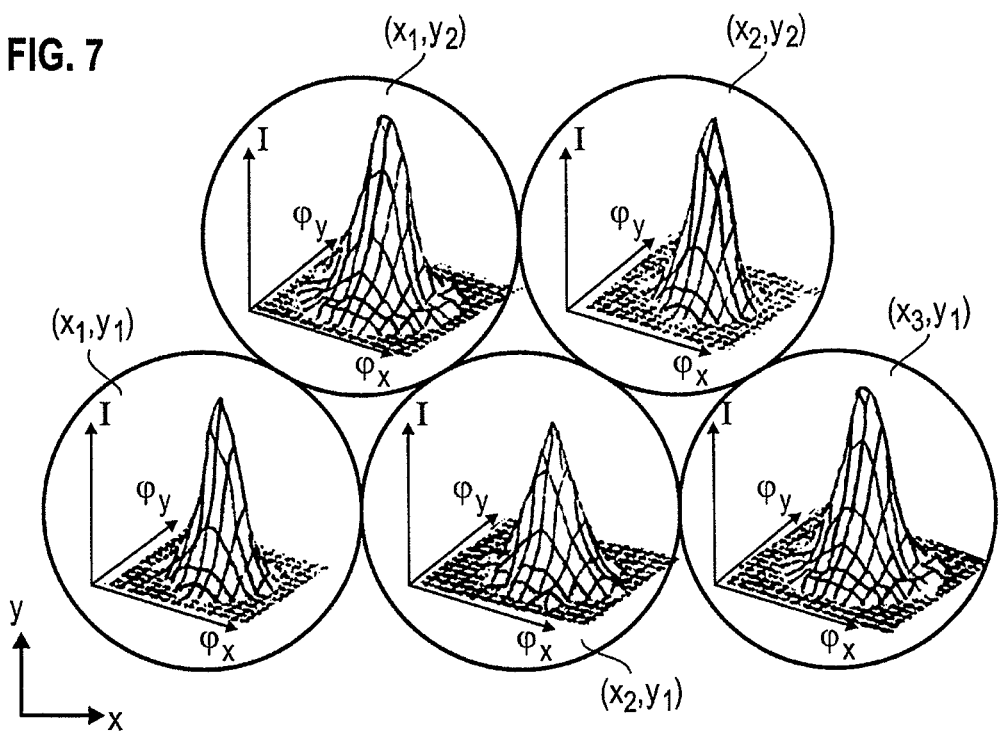

FIG. 7 illustrates exemplary measurement results for the measuring apparatus 36 disposed in the pupil plane 30 or 37 of the REMA objective 26 or of the projection objective 18 of the projection exposure tool 10 according to FIG. 6. The angularly resolved irradiation strength distributions $I(\phi_x, \phi_y)$ measured at the individual measuring field points $(x_i, y_j)$, are in this example Gaussian distributions which deviate slightly from one another.

Figure 8:
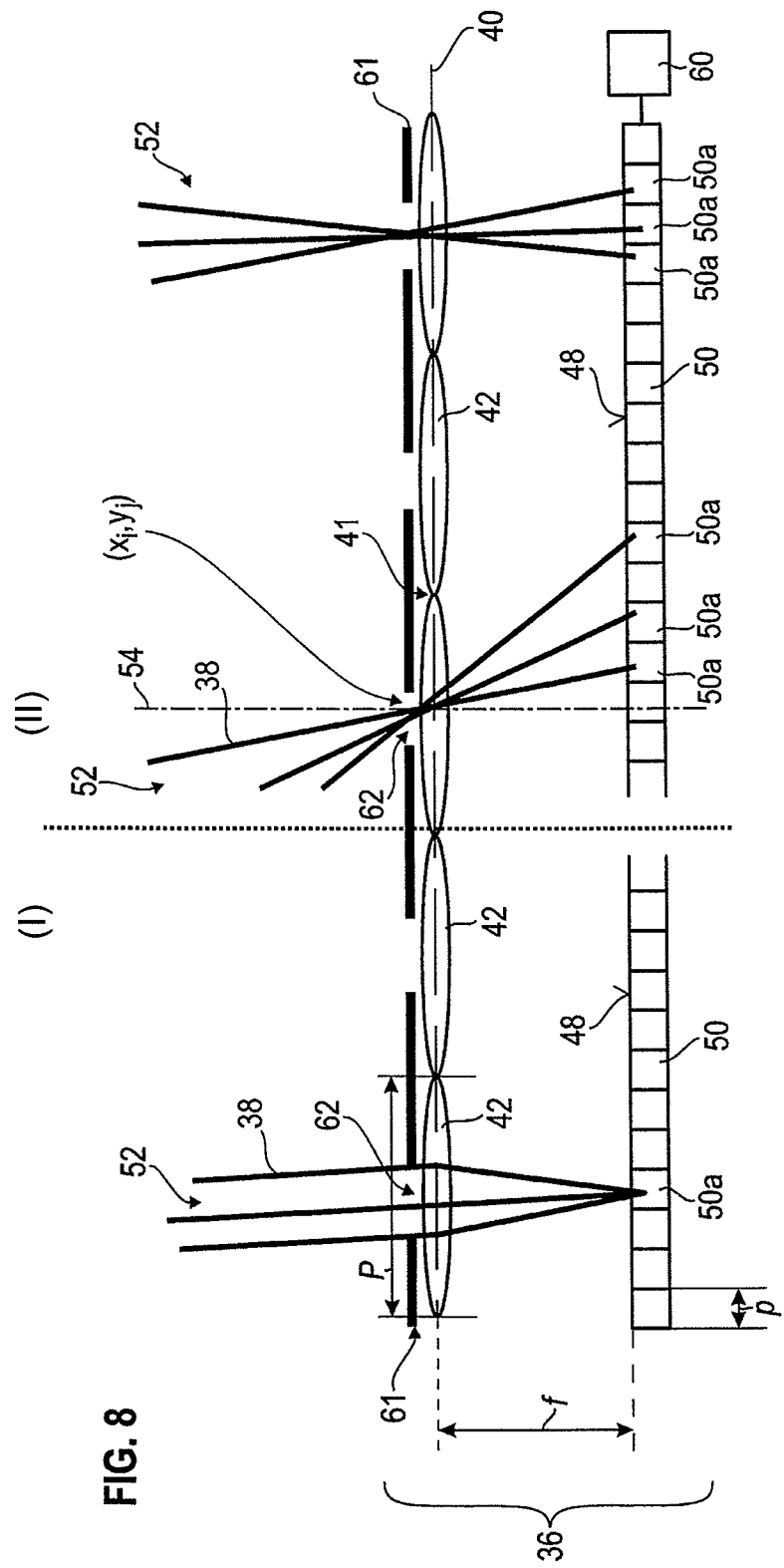

FIG. 8 shows a further embodiment of the measuring apparatus 36 according to the invention, on the left side of the figure, which is identified by (I), with the measuring apparatus disposed in the reticle plane 14 of the projection exposure tool 10, and on the right side of the figure, which is identified by (II), with the measuring apparatus 36 disposed in a pupil plane 30 or 37 of the projection exposure tool 10. The measuring apparatus 36 according to FIG. 8 differs from the measuring apparatus 36 according to FIGS. 2 and 6 in that it has a pinhole 61 in the optical path in front of the focusing optical elements 42. The pinhole 61 respectively has an aperture opening 62 in the central region of the corresponding focusing optical elements 42. Therefore, the center point of each focusing optical element 42 is selected by the pinhole 61, and so the local coordinate $(x_m, y_m)$ of the radiation reaching the measuring plane 40 is defined more precisely. In order to sample the locations lying between the aperture openings 62, according to the invention the measuring apparatus 36 is shifted to the side, i.e. in the measuring plane 40, and the results obtained on shifted grids are added together by the evaluation device 60. The aperture openings 62 have a typical opening diameter of less than 0.1 mm.

In one embodiment of the invention the measuring apparatus 36 is disposed at several of the planes of the projection exposure tool. These planes can include the reticle plane 14 illustrated above in FIG. 1, the aperture plane 23, the pupil plane 30 of the REMA objective 30, the pupil plane 37 of the projection objective 18 and/or the wafer plane 20. From the locally and angularly resolved measurement results at the different measuring planes in the optical path conclusions can be drawn with regard to the existence of error sources in the optical elements in the optical path. Furthermore, it is possible to determine the location of the error source in the optical path, roughly at least. If the measured irradiation strength distribution in a first measuring plane, e.g. the reticle plane, is within the expected standard, but if in a second measuring plane lying in the optical path behind the first measuring plane, such as e.g. the pupil plane of the projection optics, deviates from its desired distribution, the optical elements between the two measuring planes can be identified as an error source. Upon the basis of this information corresponding correction measures can be taken.

In one embodiment of the invention, by evaluating the measured irradiation strength distributions at different locations in the optical path of the projection exposure tool 10, the existence of a diffused light source is established, and this is pinpointed.

Figure 9:
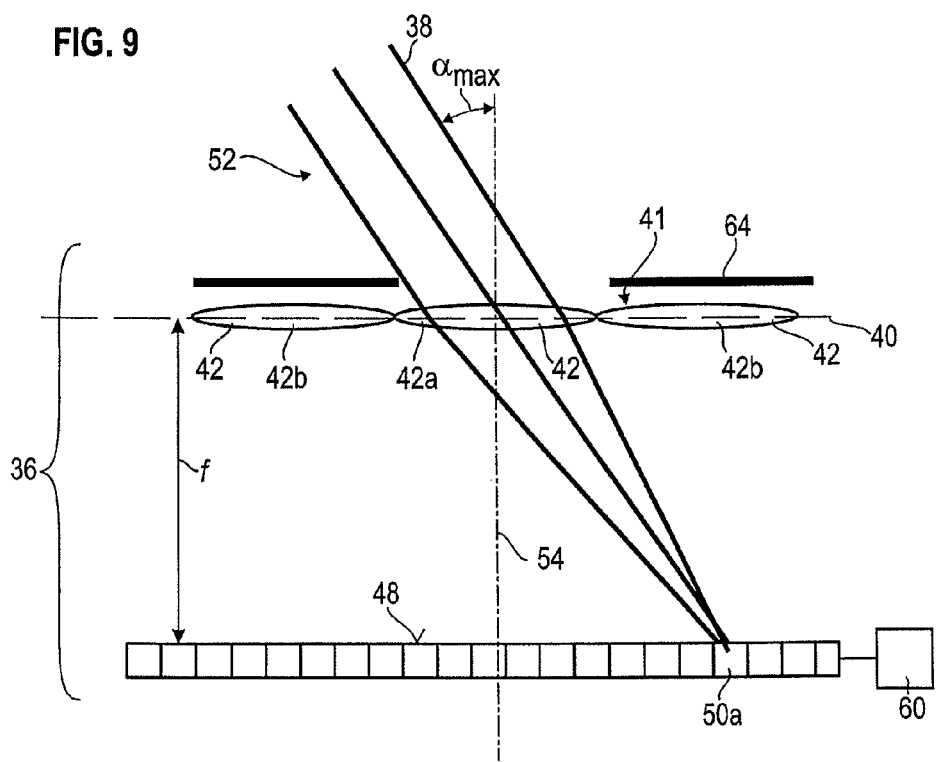

FIG. 9 shows a further embodiment of the measuring apparatus 36 according to the invention with a shielding element 64 in front of the focusing optical elements 42 in the optical path of the incident radiation 52. The shielding element 64 is in the form of a grid mask or surface light modulator (so-called "spatial light modulator") and masks a subset of the focusing optical elements 42. Advantageously, every other focusing optical element 42 is shielded from the incident radiation 52 in both coordinate directions of the measuring plane 40 of the shielding element 64.

Respectively adjacent focusing optical elements 42b of a non-shielded focusing optical element 42a are shielded from the incident radiation 52. Therefore, the maximum detectable angle of incidence $\alpha_{max}$ for the incident radiation 52 in relation to the optical axis 54 detectable without "crosstalk" is increased. This means that the detector elements 50 lying beneath a shielded optical element 42b are assigned at least partially to the corresponding adjacent, non-shielded optical element 42a. Therefore, as shown in FIG. 9, if a detector element 50a lying beneath a shielded optical element 42b is illuminated, the intensity recorded by the Ielement 50a is assigned to the adjacent non-shielded optical element 42a. In order to compensate the local resolution reduced with the embodiment of the measuring apparatus according to FIG. 9 in relation to the measuring apparatus according to FIG. 2, the measuring apparatus is preferably scanned during the measurement of the irradiation strength distribution laterally to the optical axis 54.

With a focal length of 20 mm and a distance between the focusing optical elements 42 of 250 μm, with an irradiation wavelength of 193 nm there results a maximum angle of incidence without crosstalk of $\alpha=0.36°$. With crosstalk to well below the adjacent focusing optical element this results in a maximum angle of incidence of $\alpha=1°$, and with crosstalk to the next but one microlens an angle of incidence of $\alpha=1.8°$.

Figure 10:
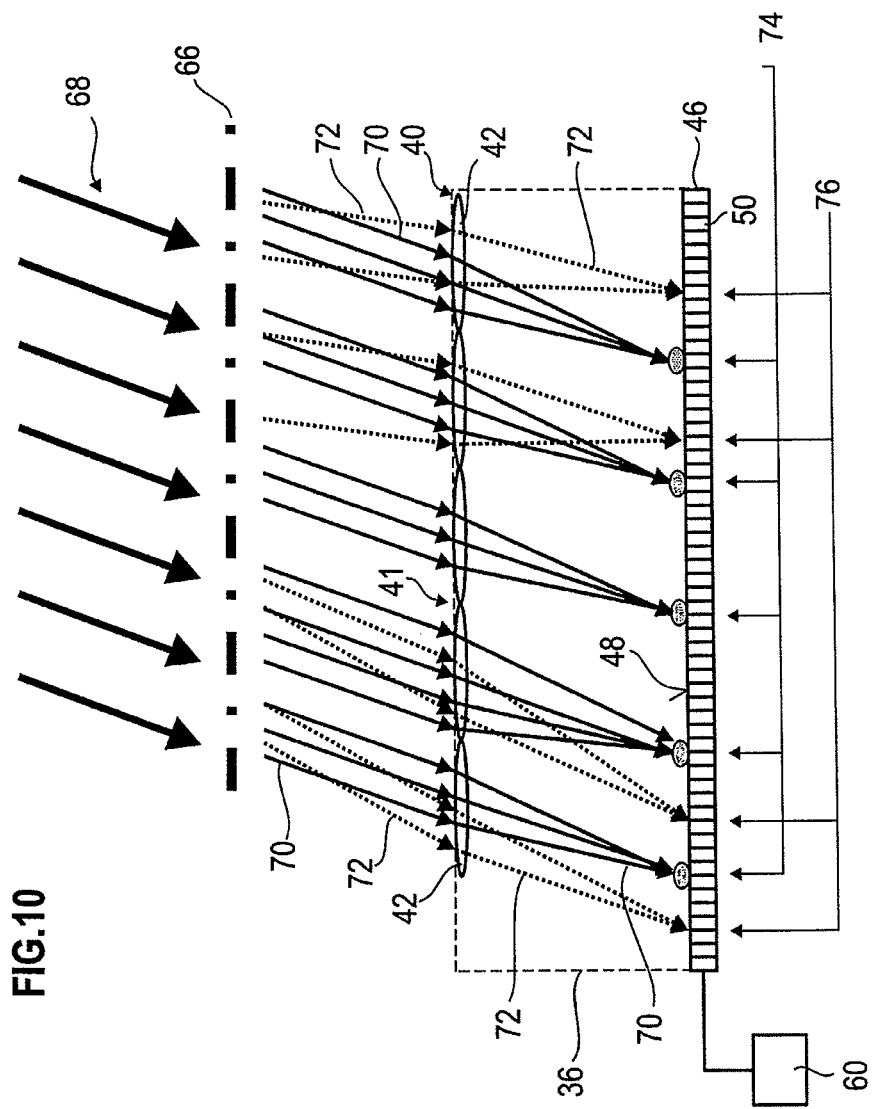

FIG. 10 shows the use of the measuring apparatus 36 according to FIG. 2 for determining diffraction efficiencies of a lithography mask 66. The measuring apparatuses 36 according to FIG. 8 or 9 or other measuring apparatuses according to the invention detailed in the application, such as for example according to FIGS. 11 to 13, can also be used for this. A diffraction efficiency is defined as the proportion of the radiation intensity going in a diffraction order different from zero of the radiation passing through the lithography mask 66. The lithography mask 66 shown in FIG. 10 is irradiated from above with illumination radiation 68, resulting in a radiation 70 of the zeroth diffraction order and a radiation 72 of a higher diffraction order, i.e. with a diffraction order which is different to zero, beneath the lithography mask 66. The radiation 70 and the radiation 72 have different propagation directions. The measuring apparatus 36 is disposed beneath the lithography mask 66. The lithography mask 66 can for example be disposed in the reticle plane 14, and the measuring apparatus 36 is correspondingly disposed for example in the wafer plane 20 of a projection exposure tool 10. Alternatively however, the lithography mask 66 can also be measured with regard to its diffraction efficiencies outside of a projection exposure tool 10.

The radiation 70 and 72 hitting the measuring plane 40 of the measuring apparatus 36 is focused by the focusing optical elements 42 onto different detector elements 50 of the locally resolving radiation detector 46. Here the radiation 70 of the zeroth diffraction order forms a so-called light disc of the zeroth order on the radiation detector 46, and the radiation 72 with the higher diffraction order corresponding light discs of a higher diffraction order in relation to the diffraction on the mask 66.

Figure 11:
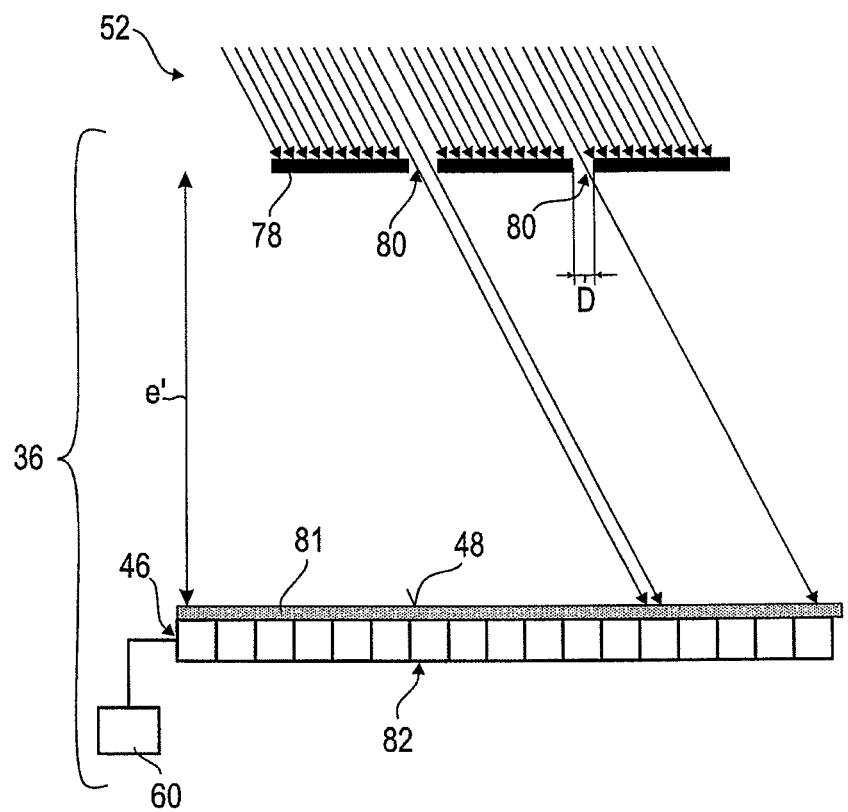

FIG. 11 shows a further embodiment of the measuring apparatus 36 according to the invention which is particularly suitable for measuring the irradiation strength distribution of an incident electromagnetic radiation 52 in the form of EUV radiation. The measuring apparatus 36 according to FIG. 11 has a pinhole grid 78 with openings 80 arranged in the form of a grid. The openings 80 form the focusing optical elements 42 of the measuring apparatus 36 and focus the incident radiation 52 onto the locally resolving radiation detector 46 using diffraction effects. The locally resolving radiation detector 46 has a fluorescence layer 81, for example P 43 of the company ASP, the surface of which forms the recording surface 48. Disposed below the fluorescence layer 81 is a locally resolving photoelectric image recording device 82, such as for example a CCD camera. The locally resolving radiation detector 46 can also be in the form of a so-called back-illuminated CCD camera. The measuring apparatus 36 according to FIG. 11 can for example be designed with a distance e' of 1 mm between the pinhole grid 78 and the radiation detector 46 and a diameter D of the openings 80 of 4 μm. This results in a minimum spot diameter for EUV radiation on the recording surface 48 of the radiation detector 46 of 8 μm. Using so-called "dithering", i.e. shifting of the radiation detector 46 in the recording surface 48 during the measurement of the irradiation strength distribution, the spot center point can be determined more precisely.

Figure 13:
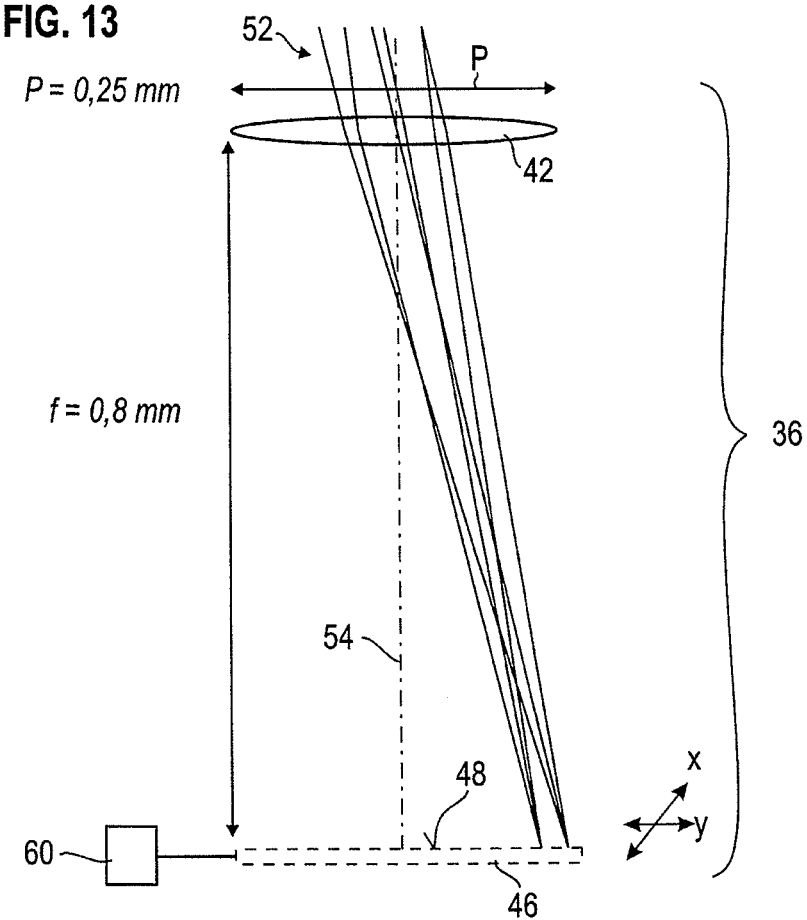

This type of "dithering" is also illustrated in FIG. 13, here however only with regard to the radiation detector 46. Here the radiation detector 46 can be moved back and forth along the two coordinate axes x and y of the recording surface 48 using a movement device. The back and forth movement happens by up to ± a width of a detector element 50 or ± a pixel width. The mathematically pushed back spot images are averaged and provide the spot center point with increased precision. With the exemplary design of the measuring apparatus 36 shown in FIG. 13, the focal length of the focusing optical elements 42 is 0.8 mm. The diameter P of the focusing optical elements 42 is 250 μm. With radiation of electromagnetic radiation with a wavelength of 193 mm, the spot diameter is 2 μm. In practice it will be increased by aberrations, estimated at approx. 5 μm. Using the dithering movement described above of the radiation detector 46 during the measurement, the spot center point can be established with a precision of approximately 0.5 μm from which an angular resolution of approx. 0.5 mrad with a typical pixel resolution of the radiation detector 46 of 0.005 mm results.

Figure 12:
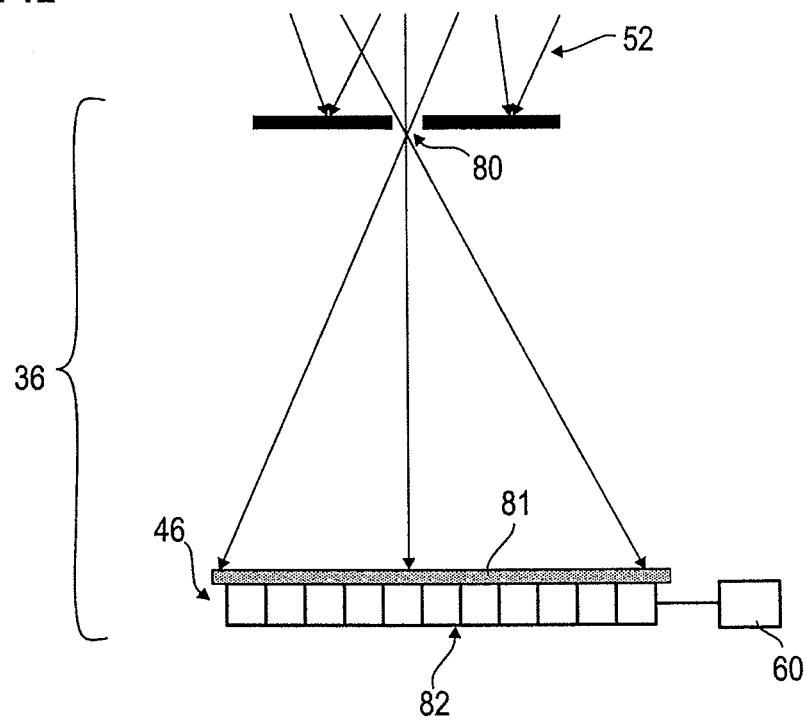

FIG. 11 shows the measuring apparatus 36 disposed in the reticle plane 14 of the projection exposure tool 10, whereas FIG. 12 shows the measuring apparatus disposed in the wafer plane 20 of the projection exposure tool 10.

Figure 14:
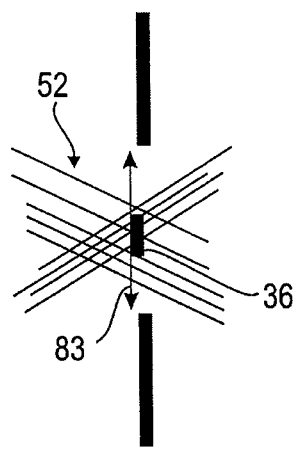

FIG. 14 illustrates a method according to the invention for measuring ray cross-sections which are greater than the extent of the measuring apparatus 36. For this purpose the measuring apparatus 36 is scanned laterally using a movement device at right angles to the direction of the incident radiation, as indicated by a double arrow 83. Thereupon, the measurement results are added together by the evaluation device 60. Optionally, the measuring apparatus 36 can also be scanned longitudinally, i.e. parallel to the optical axis 22 of the projection exposure tool 10 for the purpose of spatial sampling of the radiation field.

Figure 15:
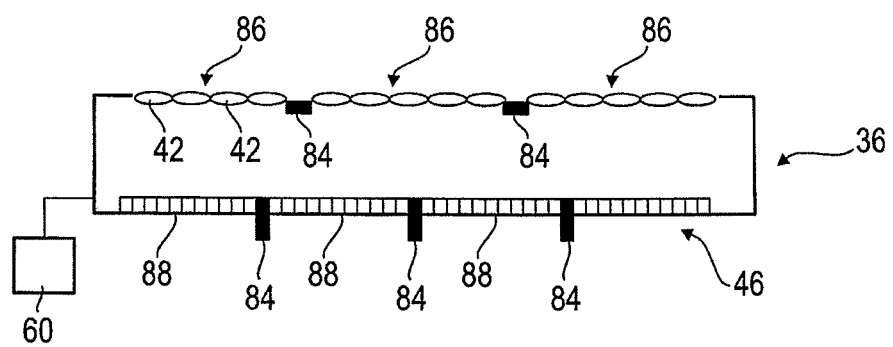

FIG. 15 shows a further embodiment of the measuring apparatus according to the invention 36. This includes several arrays 86 of focusing optical elements 42 connected to one another with respective joining elements 84. The radiation detector 46 also has several individual detector arrays which are connected to one another by joining elements 84. Large illuminated fields can be measured with the measuring apparatus 36 according to FIG. 15.

The above description of the exemplary embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection exposure tool for microlithography comprising:
 a measuring apparatus disposed in an optical path of the projection exposure tool for locally and angularly resolved measurement of an irradiation strength distribution, the measuring apparatus comprising:
a measuring field with an arrangement of focusing optical elements disposed at respective individual points of the measuring field,
a common image plane for the focusing optical elements, and
a locally resolving radiation detector with a recording surface for the locally resolved recording of a radiation intensity, the recording surface being disposed in the common image plane, the radiation detector outputting radiation intensity signals for a plurality of angle values indicative of a respective angularly resolved irradiation strength distribution for each of the individual points of the measuring field.

2. The projection exposure tool according to claim 1, wherein the radiation detector outputs radiation intensity signals for the plurality of angle values indicative of the respective angularly resolved irradiation strength distribution for each of the individual points of the measuring field.

3. The projection exposure tool according to claim 1, further comprising a wafer plane for positioning a wafer to be exposed lithographically, and wherein the measuring apparatus is disposed in the region of the wafer plane.

4. The projection exposure tool according to claim 1, wherein the focusing optical elements and the radiation detector are integrated into a separate module.

5. The projection exposure tool according to claim 1, wherein a local resolution of the radiation detector is greater than an extent of individual ones of the focusing optical elements.

6. The projection exposure tool according to claim 1, wherein the measuring apparatus measures the irradiation strength distribution at each of the points of the measuring field two-dimensionally angularly resolved.

7. The projection exposure tool according to claim 1, wherein the focusing optical elements are arranged in a grid-form in a measuring plane.

8. The projection exposure tool according to claim 1, further comprising a pinhole grid with a plurality of openings forming the focusing optical elements.

9. A projection exposure tool for microlithography comprising:
a measuring apparatus disposed in an optical path of the projection exposure tool for locally and angularly resolved measurement of an irradiation strength distribution, the measuring apparatus comprising:
a measuring field with an arrangement of focusing optical elements disposed at respective individual points of the measuring field,
a common image plane for the focusing optical elements, and
a locally resolving radiation detector with a recording surface for the locally resolved recording of a radiation intensity, the recording surface being disposed in the common image plane, the radiation detector outputting radiation intensity signals for a plurality of angle values indicative of a respective angularly resolved irradiation strength distribution for at least one of the individual points of the measuring field,
a pinhole grid with a plurality of openings forming the focusing optical elements, and
an illumination device for emitting electromagnetic radiation with a specific wavelength as the radiation, wherein the openings of the pinhole grid have respective diameters, each of which is at least twice as large as the wavelength.

10. The projection exposure tool according to claim 1, wherein at least one of: the measuring apparatus further comprises a polarizing filter, and the radiation detector is configured to be polarization-selective.

11. The projection exposure tool according to claim 1, wherein at least one of: the measuring apparatus further comprises a spectral filter, and the radiation detector is configured to be spectral-selective.

12. A projection exposure tool for microlithography comprising:
a measuring apparatus disposed in an optical path of the projection exposure tool for locally and angularly resolved measurement of an irradiation strength distribution, the measuring apparatus comprising:
a measuring field with an arrangement of focusing optical elements disposed at respective individual points of the measuring field,
a common image plane for the focusing optical elements, and
a locally resolving radiation detector with a recording surface for the locally resolved recording of a radiation intensity, the recording surface being disposed in the common image plane, the radiation detector outputting radiation intensity signals for a plurality of angle values indicative of a respective angularly resolved irradiation strength distribution for at least one of the individual points of the measuring field,
wherein the optical path comprises a bundle of individual rays, at the common image plane for the optical elements the individual rays have a maximum angular deviation $\alpha_{max}$ in relation to the respective optical axes of the optical elements, and the optical elements have respective diameters P and respective focal lengths f which conform to the following relation:

$$P/(2f) > \tan(\alpha_{max}).$$

13. The projection exposure tool according to claim 1, wherein the measuring apparatus further comprises a shielding element for shielding individual ones of the focusing optical elements from irradiation.

14. The projection exposure tool according to claim 1, wherein the measuring apparatus is disposed in a measuring plane, and further comprising an evaluation device establishing the irradiation strength distribution in the measuring plane and, in accordance with the irradiation strength distribution, calculates by ray optics an irradiation strength distribution into a target plane offset in relation to the measuring plane.

15. The projection exposure tool according to claim 14, further comprising a REMA objective with an assigned pupil plane, a reticle masking device disposed in an aperture plane, a reticle plane, a projection objective with an assigned pupil plane, and a wafer plane, wherein the target plane is disposed between two planes, the two planes selected from the pupil plane of the REMA objective, the aperture plane, the reticle plane, the pupil plane of the projection objective and the wafer plane.

16. The projection exposure tool according to claim 1, wherein the measuring apparatus further comprises a detector movement device moving the radiation detector in the common image plane.

17. The projection exposure tool according to claim 1, further comprising an apparatus movement device moving the measuring apparatus in the optical path of the projection exposure tool.

18. The projection exposure tool according to claim 1, wherein the measuring apparatus has at least one of: a plurality of arrays of focusing optical elements, which arrays are adjacent to one another, and a plurality of locally resolving individual detector arrays adjacent to one another.

19. A method for measuring an irradiation strength distribution in an optical path of a projection exposure tool for microlithography, comprising:

arranging focusing optical elements at individual points of a measuring field in the optical path of the projection exposure tool such that the focusing optical elements have a common image plane, arranging a locally resolving radiation detector such that a recording surface of the radiation detector lies in the common image plane, locally resolved recording of respective intensities of electromagnetic radiation reaching the radiation detector, and establishing a respective angularly resolved irradiation strength distribution for each of the individual measuring field points from the recorded radiation intensities.

20. The method according to claim 19, wherein:
the respective intensities are for a plurality of angle values indicative of the respective angularly resolved irradiation strength distribution for each of the individual points of the measuring field.

21. The projection exposure tool according to claim 1, wherein, for each of the individual points of the measuring field for which a respective angularly resolved irradiation strength distribution is indicated, the radiation detector outputs radiation intensity signals over a spectrum of the angle values.

* * * * *

UNITED STATES PATENT AND TRADEMARK OFFICE
CERTIFICATE OF CORRECTION

| | | |
|---|---|---|
| PATENT NO. | : 8,537,332 B2 | Page 1 of 1 |
| APPLICATION NO. | : 12/507694 | |
| DATED | : September 17, 2013 | |
| INVENTOR(S) | : Rolf Freimann | |

It is certified that error appears in the above-identified patent and that said Letters Patent is hereby corrected as shown below:

In the Specification

Column 4, Line 9: delete "real sefting" and insert -- real setting --

Column 10, Line 3: delete "Iradiation" and insert -- radiation --

Column 12, Line 25: delete "Imeasuring" and insert -- measuring --

Column 17, Line 5: delete "Ielement" and insert -- element --

Signed and Sealed this
Eighteenth Day of March, 2014

Michelle K. Lee
*Deputy Director of the United States Patent and Trademark Office*